(12) United States Patent
Asari et al.

(10) Patent No.: US 7,677,858 B2
(45) Date of Patent: Mar. 16, 2010

(54) VERTICAL HEAT TREATMENT SYSTEM AND METHOD OF TRANSFERRING PROCESS OBJECTS

(75) Inventors: Satoshi Asari, Tokyo-To (JP);
Katsuhiko Mihara, Tokyo-To (JP);
Hiroshi Kikuchi, Tokyo-To (JP)

(73) Assignee: Tokyo Electron Limited, Tokyo (JP)

( * ) Notice: Subject to any disclaimer, the term of this patent is extended or adjusted under 35 U.S.C. 154(b) by 225 days.

(21) Appl. No.: 10/593,973

(22) PCT Filed: Mar. 25, 2005

(86) PCT No.: PCT/JP2005/005518

§ 371 (c)(1),
(2), (4) Date: Sep. 22, 2006

(87) PCT Pub. No.: WO2005/093354

PCT Pub. Date: Oct. 6, 2005

(65) Prior Publication Data

US 2007/0199860 A1 Aug. 30, 2007

(30) Foreign Application Priority Data

Mar. 25, 2004 (JP) ............................. 2004-089515
Mar. 1, 2005 (JP) ............................. 2005-055271

(51) Int. Cl.
*B66C 17/08* (2006.01)
(52) U.S. Cl. .................................. 414/147; 294/103.1
(58) Field of Classification Search ................ 414/147, 414/191, 204; 294/87.2, 104, 103.1
See application file for complete search history.

(56) References Cited

U.S. PATENT DOCUMENTS 5,133,635 A * 7/1992 Malin et al. .............. 414/744.8

(Continued)

FOREIGN PATENT DOCUMENTS

JP 05-013547 1/1993

(Continued)

OTHER PUBLICATIONS

Notification of Transmittal of Translation of the International Preliminary Report on Patentability (Form PCT/IB/338)—PCT/JP2005/005518, dated Jan. 2004.

(Continued)

*Primary Examiner*—Saúl J Rodríguez
*Assistant Examiner*—Joshua I Rudawitz
(74) *Attorney, Agent, or Firm*—Smith, Gambrell & Russell, LLP (57) ABSTRACT

Disclosed is an improved transfer mechanism that transfers, in a vertical heat treatment system, process objects W between a container (carrier), and a holder (boat) holding plural process objects at vertical intervals. The transfer mechanism includes plural substrate support devices spaced at intervals, and each of the substrate support devices has a gripping mechanism for gripping a process object on the under side. The gripping mechanism includes a fixed engagement member on a distal end of the substrate support device, and a movable engagement member movably attached to a proximal end of the substrate support device.

5 Claims, 6 Drawing Sheets

U.S. PATENT DOCUMENTS

| | | | |
|---|---|---|---|
| 5,445,486 A * | 8/1995 | Kitayama et al. | 414/416.03 |
| 5,810,935 A * | 9/1998 | Lee et al. | 118/728 |
| 5,813,819 A * | 9/1998 | Ohsawa et al. | 414/416.08 |
| 6,167,322 A * | 12/2000 | Holbrooks | 700/112 |
| 6,540,465 B2 * | 4/2003 | Tometsuka | 414/160 |
| 6,758,876 B2 * | 7/2004 | Suzuki et al. | 55/385.6 |
| 6,817,640 B2 * | 11/2004 | Menon et al. | 294/103.1 |
| 6,909,276 B2 * | 6/2005 | Hofer et al. | 324/158.1 |
| 7,140,655 B2 * | 11/2006 | Kesil et al. | 294/104 |
| 2001/0016307 A1 * | 8/2001 | Ishii | 432/239 |
| 2001/0048867 A1 | 12/2001 | Lebar et al. | |
| 2001/0052325 A1 * | 12/2001 | Tometsuka | 118/729 |
| 2002/0197145 A1 * | 12/2002 | Yamamoto et al. | 414/806 |
| 2004/0048474 A1 * | 3/2004 | Asano | 438/689 |

FOREIGN PATENT DOCUMENTS

| | | |
|---|---|---|
| JP | 2001-267262 | 9/2001 |
| JP | 2002-134586 | 5/2002 |
| JP | 2002-141405 | 5/2002 |
| JP | 2002-289666 | 10/2002 |
| JP | 2003-338531 | 11/2003 |
| JP | 2004-79569 | 3/2004 |

OTHER PUBLICATIONS

PCT International Preliminary Report on Patentability (Form PCT/IB/373)—PCT/JP2005/005518, dated Jan. 2004.

Translation of PCT Written Opinion of the International Searching Authority—(Form PCT/ISA/237)—PCT/JP2005/005518, dated Jan. 2004.

European Search Report.

Japanese Office Action issued on Jul. 1, 2008 with English translation.

* cited by examiner

VERTICAL HEAT TREATMENT SYSTEM AND METHOD OF TRANSFERRING PROCESS OBJECTS

TECHNICAL FIELD

The present invention relates to a vertical heat treatment system and a method of transferring process objects, and more particularly to improvement in a transfer system enabling it to transfer plural process objects collectively to a holder having ring-shaped support plates.

BACKGROUND ART

A manufacturing process of a semiconductor device includes various process steps that perform various heat treatments, such as an oxidation treatment, a diffusion treatment, a CVD treatment, and an annealing treatment, to a process object, e.g., a semiconductor wafer. A vertical heat treatment system capable of heat-treating plural wafers at one time has been used as one of heat treatment systems for performing the foregoing process steps.

The vertical heat treatment system includes: a heat treatment furnace having a furnace throat in its lower end; a lid that hermetically closes the furnace throat; a holder (also referred to as "wafer boat") disposed on the lid to hold plural wafers at predetermined vertical intervals via ring-shaped support plates; an elevating mechanism that vertically moves the lid to load and unload into and from the heat treatment furnace; and a transfer mechanism that transfers wafers between the holder and a container (also referred to as "carrier" or "cassette") for holding therein plural wafers at predetermined intervals. The transfer mechanism is provided with plural substrate support devices (also referred to as "forks") spaced at predetermined intervals. The ring-shaped support plate is employed for suppressing or preventing slippage (i.e., crystal defect) which may occur in the peripheral portion of a wafer during a heat treatment at a high temperature.

Figure 12:
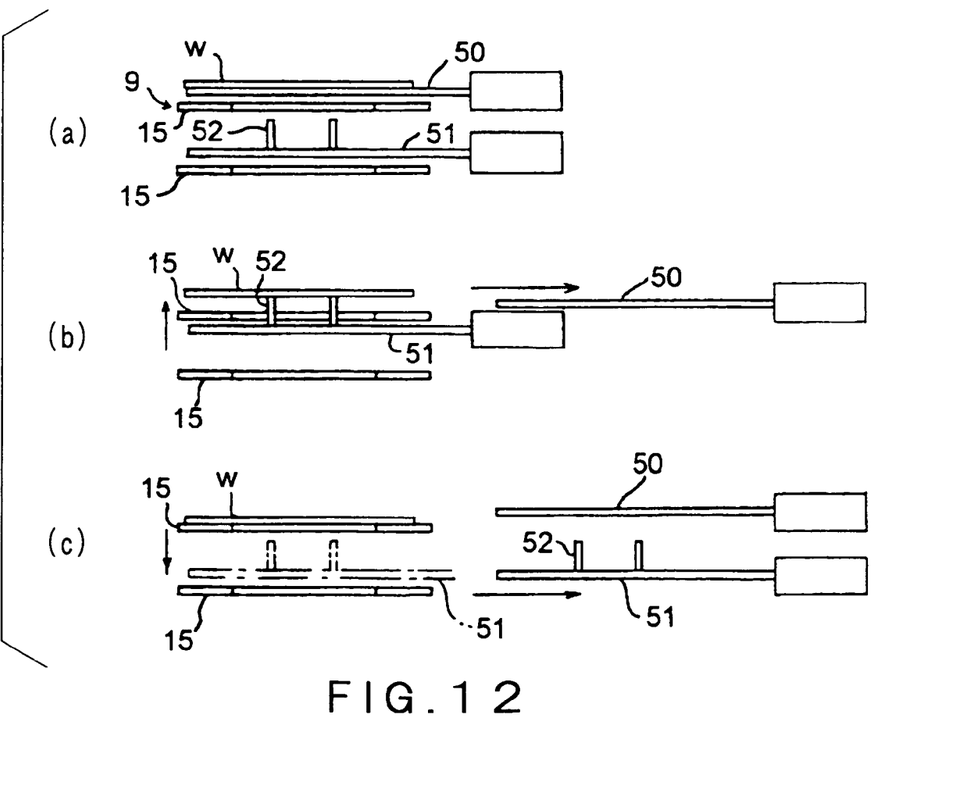
FIG. 12 shows views illustrating an example of a conventional transfer mechanism of a vertical heat treatment system.

JP5-13547A discloses a vertical heat treatment system provided with a push-up type transfer mechanism (hereinafter referred to as "transfer mechanism A") including a substrate support device 50 for conveyance and a substrate support device 51 for pushing-up operation, which is shown FIG. 12. The substrate support device 50 comprises a plate-shaped member having an upper surface for supporting thereon the lower surface of a wafer W. The substrate support device 51 for pushing-up operation comprises a plate-shaped member provided thereon with three supporting pins 52 each having an upper surface for supporting thereon the lower surface of a wafer W.

When transferring a wafer to a holder 9, the substrate support device 50 for conveyance supporting a wafer W is at first positioned above a ring-shaped support plate 15 in the holder 9, while the substrate support device 51 for pushing-up operation is positioned below the ring-shaped support plate 15 (FIG. 12(a)). Then, the substrate support device 51 for pushing-up operation is elevated to raise the wafer W from the substrate support device 50 for conveyance, and the substrate support device 50 for conveyance is withdrawn from the holder 9 while the wafer W is kept raised by the substrate support device 51 (FIG. 12(b)). Then, the substrate support device 51 for pushing-up operation is lowered to place the wafer W onto the ring-shaped support plate 15, and thereafter the substrate support device 51 for pushing-up operation is withdrawn from the holder 9 (FIG. 12(c)). In this manner, the transferring operation of one wafer is completed.

JP2003-338531A discloses a vertical heat treatment system provided with a transfer mechanism (hereinafter referred to as "transfer mechanism B") configured to support a substrate on the lower side of a fork (i.e., a substrate support device) in such a manner that the substrate is suspended from the fork. The transfer mechanism has plural engagement members each projecting downward from the folk and having an L-shaped cross section. The lower surface of a wafer is supported, at a peripheral portion thereof, on an upper surface of a horizontally-extending portion of each L-shaped engagement member. The respective engagement members are driven by an actuator to move between a wafer support position where the engagement members support a wafer, and a wafer release position where the respective engagement members are moved outside the outer peripheral edge of the wafer to release the wafer.

Both of the foregoing transfer mechanisms A and B transfer wafers only one by one. Thus, a long time is needed for wafer transfer operation, which inhibits improvement of throughput. Since the transfer mechanism has a large thickness (i.e., the size measured in the height direction) due to its structure, the arrangement pitch of the ring-shaped support plates in the holder must be as large as, for example, 16 mm. Thus, the maximum number of wafers to be held (treated) in a holder of a predetermined size is about 50 at most, which also inhibits improvement of throughput. Meanwhile, in the transfer mechanism B, all the engagement members disposed on the distal end side and the proximal end side of the fork are movable, and thus a complicated structure is added to the fork. Therefore, the height of the fork is undesirably increased, which makes it difficult to reduce the arrangement pitch of the ring-shaped support plates in the holder.

DISCLOSURE OF THE INVENTION

A generic object of the present invention is to improve the throughput of a vertical heat treatment system.

An object of the present invention is to enable plural process objects to be simultaneously transferred to a holder having ring-shaped support plates, thereby reducing a time required for transferring the process objects.

Another object of the present invention is to simplify the structure of a transfer mechanism, more specifically, a gripping mechanism of each substrate supporting device of the transfer mechanism so that the substrate supporting device can be inserted into a narrow space, thereby to reduce the arrangement pitch of the ring-shaped support members and to increase the number of the process objects to be heat-treated at one time.

The present invention provides a vertical heat treatment system including: a heat treatment furnace having a furnace throat in a lower part thereof; a lid that hermetically closes the furnace throat; a holder, disposed on the lid, that holds a plurality of process objects at vertical intervals via ring-shaped support plates; an elevating mechanism that moves the lid vertically to load and unload the holder into and from the heat treatment furnace; and a transfer mechanism, including a plurality of substrate support devices spaced at intervals, that transfers process objects between the holder and a container holding therein a plurality of process objects at intervals, wherein: the transfer mechanism has gripping mechanisms each configured to grip a process object on an under side of respective one of the substrate support devices, and each of the gripping mechanisms has a fixed engagement member fixedly provided on a distal end of respective one of the substrate support devices to be engaged with a front edge portion of a process object and a movable engagement member movably attached to a proximal end of respective one of the substrate support devices to be disengageably engaged with a rear edge portion the process object.

Preferably, each of the substrate support devices is provided with seats that receive front and rear peripheral portions, respectively, such that a gap is formed between a lower surface of the substrate supporting device and an upper surface of the process object. Thus, the upper surface of each process object can be prevented from being rubbed and damaged by the lower surface of the substrate support device, when the process object is gripped.

Preferably, each of the ring-shaped support plates has cutouts for preventing the ring-shaped support plate from colliding with the fixed engagement member and the movable engagement member. Thus, the gripping mechanism can securely grip the process object without colliding with by the ring-shaped support plate.

Preferably, at least one of the substrate support device is provided with a mapping sensor, which is configured to detect a position of a detection object by moving the substrate support device such that a light beam traveling between two distal ends of the substrate support device is interrupted by the detection object. Thus, the existence of a process object W on each of the ring-shaped support plate can be detected by scanning plural process objects W placed on the respective ring-shaped support plates 15 in the holder 9 along the direction in which the process objects W are arranged, and thereby the mapping of the process objects can be performed. Further, since it is possible to detect whether a process object W sticks out of the holder 9 before and after the heat treatment of the process object W, troubles such as damage of the process object W can be avoided.

Preferably, the fixed engagement member and the movable engagement member are formed of a heat-resistant resin. Thus, durability of the fixed engagement member and the movable engagement member can be improved. Further, these engagement members do not act as contaminant sources for the process object.

The present invention also provides a method of transferring process objects in a vertical heat treatment system including: a heat treatment furnace having a furnace throat in a lower part thereof; a lid that hermetically closes the furnace throat; a holder, provided on the lid, that holds a plurality of process objects at vertical intervals via ring-shaped support plates; an elevating mechanism that moves the lid vertically to load and unload the holder into and from the heat treatment furnace; and a transfer mechanism that transfers process objects between the holder and a container holding therein a plurality of process objects at intervals, wherein said method employs, as the transfer mechanism, a transfer mechanism including a plurality of substrate support devices spaced at intervals, and having gripping mechanisms each configured to grip a process object on an under side of respective one of the substrate support devices, and each of the gripping mechanisms has a fixed engagement member fixedly provided on a distal end of respective one of the substrate support devices to be engaged with a front edge portion of a process object and a movable engagement member movably attached to a proximal end of respective one of the substrate support devices to be disengageably engaged with a rear edge portion the process object, and wherein said method includes the steps of: placing each of the substrate support devices above respective one of the process objects positioned in their transfer start position; moving the movable engagement members toward the fixed engagement members to grip the process objects; moving the substrate support devices each gripping the process object to a position above their transfer target position; and moving the movable engagement members away from the fixed engagement members to release the process objects whereby the process objects are mounted on their transfer target position.

DESCRIPTION OF REFERENCE SIGNS

1 . . . Vertical heat treatment system
W . . . Semiconductor wafer (Process object)
3 . . . Heat treatment furnace
4 . . . Furnace throat
6 . . . Lid
9 . . . Holder
11 . . . Elevating mechanism
15 . . . Ring-shaped support plate
16 . . . Container
20 . . . Substrate support device (process object support device)
21 . . . Transfer mechanism
28 . . . Gripping mechanism
30 . . . Fixed engagement member
31 . . . Movable engagement member
34, 35 . . . Seat
36, 37 . . . Cutout
40 . . . Mapping sensor

BEST MODE FOR CARRYING OUT THE INVENTION

Figure 1:
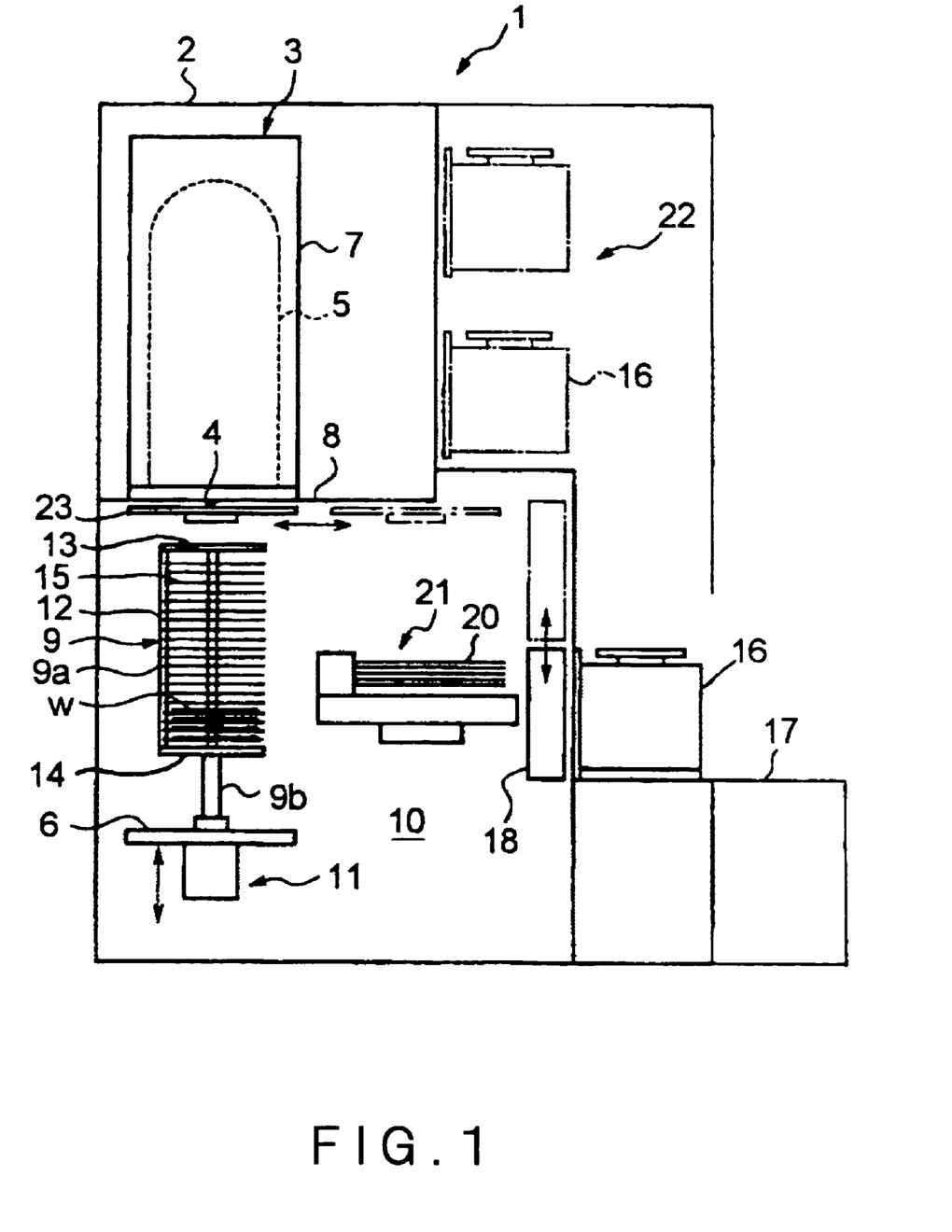
FIG. 1 is a longitudinal cross-sectional view schematically showing a vertical heat treatment system in one embodiment of the present invention.
Figure 2:
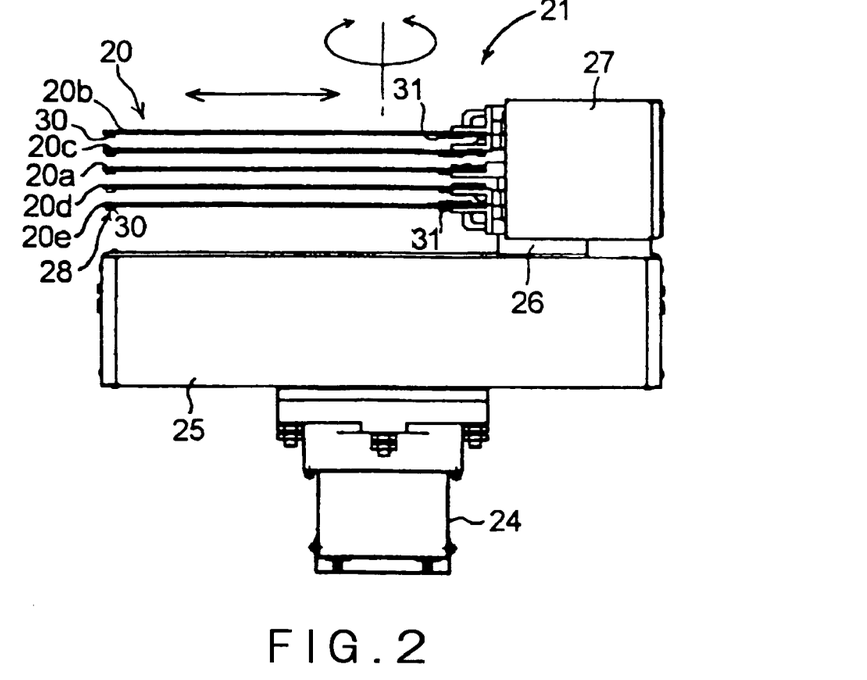
FIG. 2 is a side view of a transfer mechanism.
Figure 3:
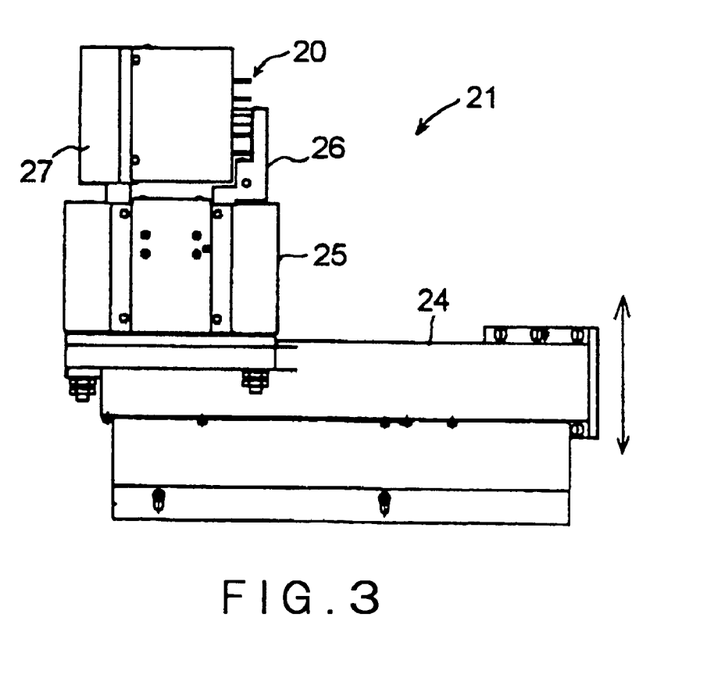
FIG. 3 is a side view of the transfer mechanism of FIG. 2 viewed from another side.
Figure 4:
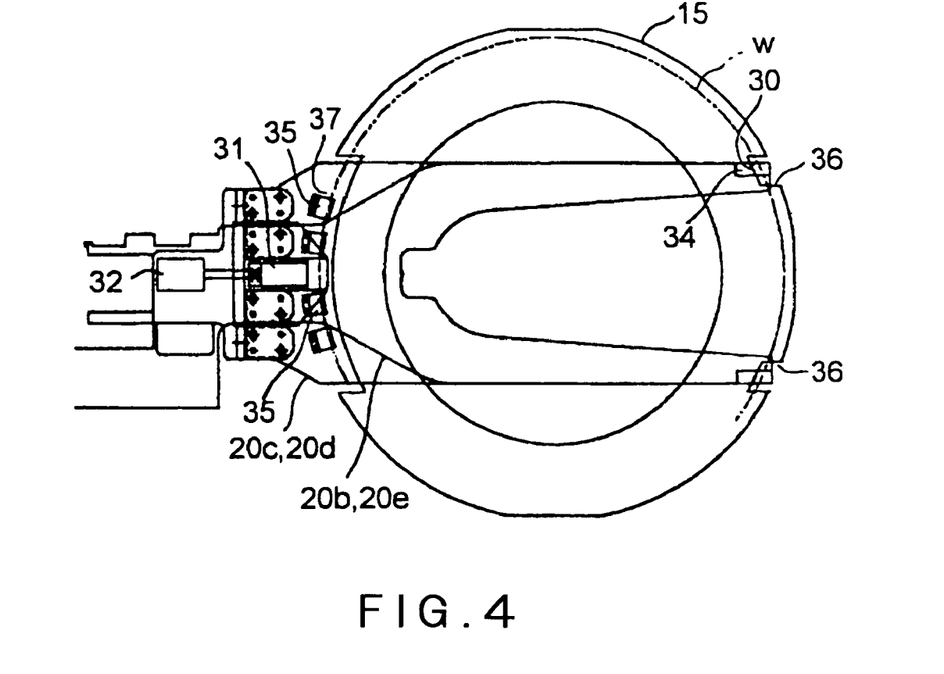
FIG. 4 is a plan view of a substrate support device and related parts of the transfer mechanism.
Figure 5:
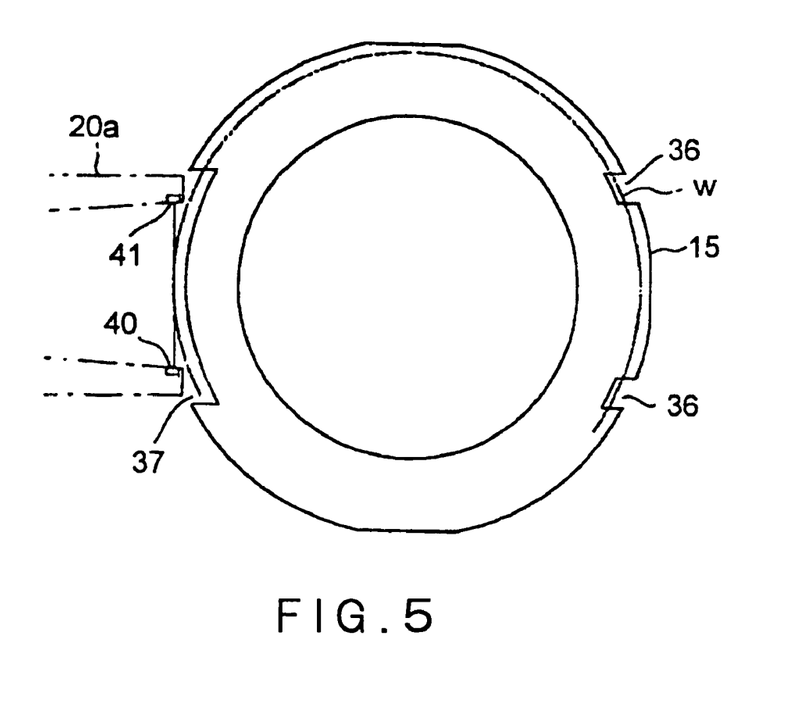
FIG. 5 is a plan view of a ring-shaped support plate.

The best mode for carrying out the invention will be described in detail with reference to the accompanying drawings. FIG. 1 is a longitudinal cross-sectional view schematically showing a vertical heat treatment system in one embodiment of the present invention. FIG. 2 is a side view of a transfer mechanism. FIG. 3 is a side view of the transfer mechanism of FIG. 2 viewed from another side. FIG. 4 is a plan view of a substrate support device and related parts of the transfer mechanism. FIG. 5 is a plan view of a ring-shaped support plate.

As shown in FIG. 1, a vertical heat treatment system 1 includes an enclosure 2 serving as a frame of the system. A vertical heat treatment furnace 3 is provided in the enclosure 2 at an upper part thereof. The heat treatment furnace 3 accommodates process objects (also referred to as "substrates to be processed") such as semiconductor wafers W of a thin circular disk shape, and performs a predetermined treatment, e.g., a CVD treatment. The heat treatment furnace 3 mainly composed of: a vertically-elongated, processing vessel (in the illustrated embodiment, a reaction tube formed of quartz) having a lower end opening serving as a furnace throat; a vertically-movable lid 6 for opening and closing the furnace throat 4 of the reaction tube 5; and a heater (heating mechanism) 7 surrounding the reaction tube 5 to heat the same at a predetermined controlled temperature, e.g., 300° C. to 1200° C.

A base plate 8 formed of a stainless steel is arranged horizontally in the enclosure 2 to support the reaction tube 5 and the heater 7 constituting the heat treatment furnace 3. The base plate 8 has an opening (not shown) through which the reaction tube 5 is inserted.

The reaction tube 5 is inserted upward into the opening in the base plate 8 from below, and an outwardly-extending flange part formed in a lower end part of the reaction tube 5 is secured to the base plate 8 by means of flange holding members, whereby the reaction tube 5 is mounted to the base plate 8. It is possible to detach the reaction tube 5 from the base plate 8 for a cleaning operation or the like. Plural gas inlet pipes (not shown) are connected to the reaction tube 5 to supply process gases and an inert gas for purging operation into the reaction tube 5. An exhaust pipe, which is provided thereon with a vacuum pump and a pressure control valve capable of evacuating the reaction tube to a controlled reduced pressure, is also connected to the reaction tube 5.

A work area (loading area) 10 is provided below the base plate 8 in the enclosure 2. In the work area 10, the holder (i.e., boat) 9 mounted to the lid 6 is loaded into the heat treatment furnace 3 (i.e., the reaction tube 5) and is unloaded therefrom, and wafers W are transferred to the holder 9. An elevating mechanism 11 is provided in the work area 10 to vertically move the lid 6 so as to load and unload the boat 9 into and from the heat treatment furnace 3. The lid 6 comes into contact with the open end part of the furnace throat 4 to hermetically close the same. A rotating mechanism (not shown) is disposed on a lower side of the lid 6.

The holder 9 includes a main body 9a for supporting plural wafers W at multiple levels, and a leg 9b for supporting the main body 9a. The leg 9b is connected to a rotating shaft of the rotating mechanism. The holder 9 as illustrated is formed of quartz, and is capable of holding plural, e.g., about 75, wafers W each having a large diameter, e.g., 300 mm, via ring-shaped support plate 15. In the holder 9, the wafers are held in a horizontal posture while being spaced at predetermined vertical intervals, e.g., an arrangement pitch of 11 mm. A lower heating mechanism (not shown) is provided between the main body 9a and the lid 6 to prevent lowering of the temperature in the reaction tube 5 which may be caused by heat dissipation through the furnace throat 4. The holder 9 need not have the leg 9b. In this case, the main body 9a is mounted on the lid 6 through a heat-insulating tube. The holder 9 includes: plural struts 12; a top plate 13 connected to the upper ends of the struts 12; a bottom plate 14 connected to the lower ends of the struts 12; and the ring-shaped support plates 15 arranged on the struts 12. The ring-shaped support plates 15 are arranged at multiple levels while they are engaged with recesses or projections which are formed in the struts 12 and spaced at predetermined intervals. The ring-shaped support plates 15 are formed of, e.g., quartz or ceramics; have a thickness of about 2 mm to 3 mm; and have a diameter slightly larger than the outer diameter of the wafer W.

A table (also referred to as "loading port") 17 is provided at a front end portion of the enclosure 2. A container (also referred to as "carrier" or "cassette") 16 holding therein plural, e.g., about 25, wafers W at predetermined intervals is placed on the table 17; the wafers W are transferred from the container 16 into the enclosure 2, and vise versa. The container 16 is an airtight container provided with a detachable cover (not shown) at the frond side thereof. A door mechanism 18 is provided in the front end of the work area 10 to remove the cover of the container 16 so that the interior of the container is communicated with the work area 10. Provided in the work area 10 is a transfer mechanism 21, which has plural substrate support devices 20 (also referred to as "forks") spaced at predetermined intervals, and transfers the wafers W between the container 16 and the holder 9.

In a front upper part outside the work area 10 in the enclosure 2, there are provided a storage shelf 22 for storing thereon containers 16, and a transfer mechanism (not shown) for transferring a container 16 from the table 17 to the storage shelf 22, and vice versa. A shutter mechanism 23 is disposed in an upper part of the work area 10 to cover or close the furnace throat 4, in order to suppress or prevent releasing of heat from the high-temperature furnace to the below working area 10 through the furnace throat 4 when the lid 6 is opened.

The transfer mechanism 21 is includes plural, e.g., five, substrate support devices (also referred to as "forks" or "support plates") 20 (20a to 20e) that support plural, e.g., five, wafers W at predetermined vertical intervals. The middle substrate support device 20a can move independently from the other substrate support devices in the front-and-rear directions. The substrate support devices (first, second, forth, and fifth substrate support devices from above) 20b, 20c, 20d, and 20e other than the middle substrate support device 20a can be moved vertically in a stepless manner (continuously) with respect to the middle substrate support device 20a, by means of a pitch changing mechanism (not shown). That is, the vertical intervals (i.e., arrangement pitch) of the five substrate support devices 20a to 20e can be changed in a stepless manner, relative to the middle substrate support device 20a as a reference. Therefore, even if the intervals at which the wafers W are held in the container 16 are different from those at which the wafers W are to be held in the holder 9, it is possible to transfer plural wafers collectively W between the container 16 and the holder 9.

The transfer mechanism 21 has an elevating arm 24 capable of vertical movement, and a box-shaped base 25 attached to the elevating arm 24 such that the base 25 can be rotated in a horizontal plane. Arranged on the base 25 are a first moving member 26 and a second moving member 27 each of which is capable of moving in the longitudinal direction of the base 25. The substrate support device 20a, or the middle one, can be moved forward by means of the first moving member 26. Four substrate support devices 20b to 20e, which are arranged above and below the middle substrate support device 20a two by two, can be moved forward by means of the second moving member 27. This arrangement achieves a single-wafer transfer mode in which only the first moving member 26 moves to transfer a single wafer W, and a collective transfer mode in which both the first and second moving members 26 and 27 move together to transfer plural (in this case, five) wafers collectively. The base 25 provided therein with a not shown moving mechanism for operating the first and the second moving mechanism 26 and 27. The moving mechanism and the pitch changing mechanism used herein may be those disclosed in JP2001-44260A, for example.

Figure 6:
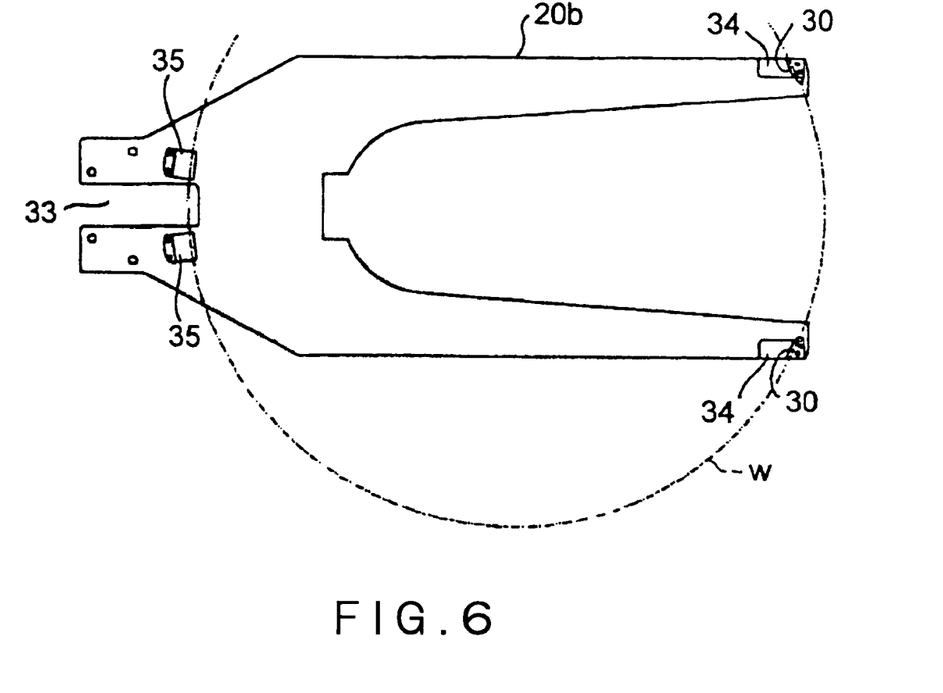
FIG. 6 is a plan view of the substrate support device viewed from below.
Figure 7:
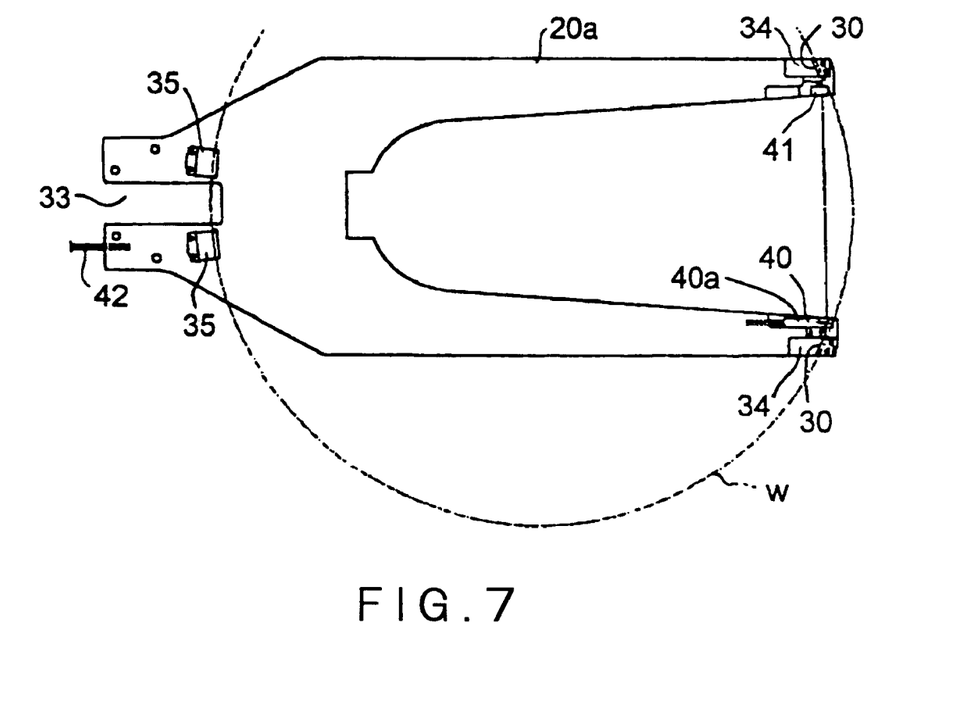
FIG. 7 is a plan view of another substrate support device viewed from below.
Figure 8:
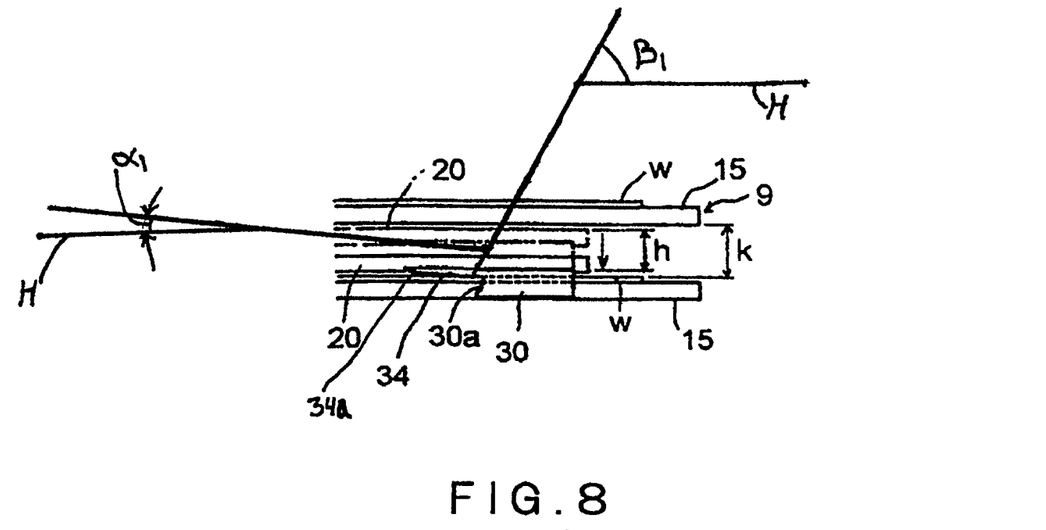
FIG. 8 is a schematic side view of a fixed engagement member and a seat arranged on a distal end of the substrate support device.
Figure 9:
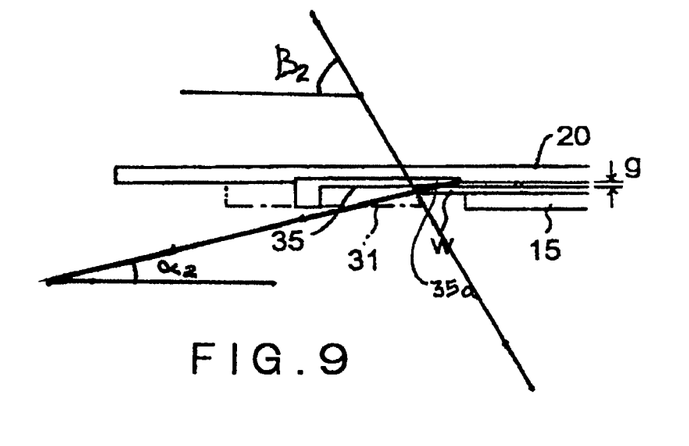
FIG. 9 is a schematic side view of a movable engagement member and a seat arranged on a proximal end of the substrate support device.
Figure 10:
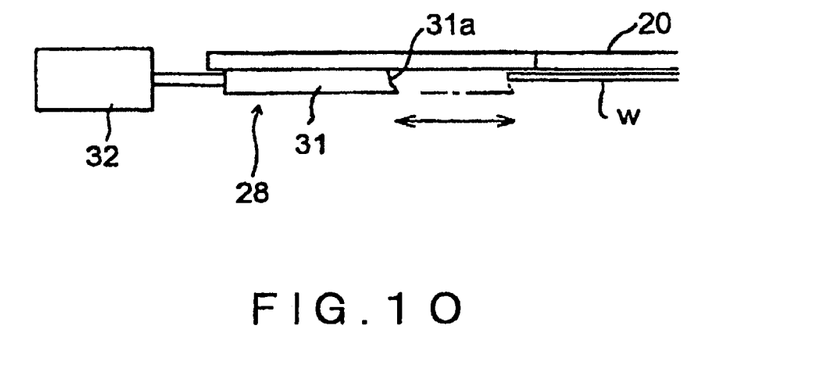
FIG. 10 is a schematic side view of the movable engagement member and a driving unit arranged on the proximal end of the substrate support device.

Each of the substrate support devices 20 is formed of a thin plate of alumina ceramics, and preferably, the distal side portion thereof is bifurcated to be in a substantially a U-shape (see FIGS. 4, 6, and 7). The transfer mechanism 21 is provided with gripping mechanisms 28 each capable of holding a wafer W from its front and rear sides on the underside of the corresponding substrate support device. As shown in FIGS. 8 to 10, the gripping mechanism 28 includes: a fixed engagement members 30 disposed on distal ends of the substrate support device 20 to be engaged with the front edge of the wafer W; a movable engagement member 31 disposed on a proximal end of the substrate support device 20 to be disengageably engaged with the rear edge of the wafer W; and a driving mechanism such as an air cylinder actuator 32 for driving the movable engagement member 31.

When the movable engagement member 31 is moved forward by the air cylinder 32, the wafer W is held (gripped) between the movable engagement member 31 and the fixed engagement members 30. When the movable engagement member 31 is moved rearward, the wafer W is released. It is preferable that the substrate support device 20 has at its proximal end a cutout 33 for preventing collision between the substrate support device 20 and the movable engagement member 31.

Preferably, the fixed engagement member 30 and the movable engagement member 31 are respectively provided with inclined surfaces 30a and 31a for supporting the front and rear peripheral edges of the wafer W, such that the wafer W is not disengaged from the engagement members 30 and 31 due to the wafer's own weight. Each substrate support device 20 preferably has seats 34 and 35 having inclined surfaces 34a and 35a, respectively, and serving as spacers for receiving the front and rear peripheral portions of the wafer W, such that a gap (g) is formed between the lower surface of the substrate support device 20 and the upper surface of the wafer W supported by the same. The angle ($\alpha 1$) of inclination of the inclined surface ($34a$) of the front seat (34) with respect to a horizontal plane (H) is smaller than the angle ($\beta 1$) of inclination of the inclined surface ($30a$) of the fixed engagement member (30) with respect to the horizontal plane (H). The angle ($\alpha 2$) of inclination of the inclined surface ($35a$) of the rear seat (35) with respect to the horizontal plane (H) is smaller than the angle ($\beta 2$) of inclination of the inclined surface ($31a$) of the movable engagement member ($\beta 1$) with respect to the horizontal plane (H). In this embodiment, a pair of right and left seats 34 are disposed on the right and left distal ends of the substrate support device 20, respectively, while a pair of right and left seats 35 are disposed on the right and left proximal ends of the substrate support device 20, respectively. The seat 34 and the fixed engagement member 30 on the distal ends are integrally formed (as a single piece) to achieve the compactness thereof. The fixed engagement members 30, the movable engagement member 31, and the seats 34 and 35 are preferably formed of a heat resistant resin such as PEEK (polyetheretherketone), in terms of improvement in their durability and of preventing them from serving as contaminant sources.

If the outer diameter of the ring-shaped support plate 15 is larger than that of the wafer W, the ring-shaped support plate 15 preferably has cutouts 36 and 37 as shown in FIGS. 4 and 5, in order to prevent the ring-shaped support plate 15 from colliding with the fixed engagement members 30, the movable engagement member 31, and, depending on the circumstances, the seats 35 on the proximal end. On the other hand, if the outer diameter of the ring-shaped support plate 15 is smaller than that of the wafer W, it is not always necessary to form the cutouts 36 and 37 in the ring-shaped support plate 15.

In order to allow the substrate support device 20 to be inserted into a space between vertically adjacent two ring-shaped support plates 15, the distance (h) between the upper surface of the substrate support device 20 and the lower surface of the fixed engagement member 30 is preferably smaller than the distance (k) (which is about 7.7 mm) between the lower surface of the upper ring-shaped support plate 15 and the upper surface of the wafer W placed on the lower ring-shaped support plate 15, and the distance (h) may be about 5.95 mm, for example. The substrate support device 20a used for a single-wafer transfer operation has at its distal ends a mapping sensor 40 for mapping wafers W held by the holder 9.

In the illustrated embodiment, a sensor head 40a of the mapping sensor 40, which is capable of emitting and receiving an infrared light, is disposed on one of the distal ends of the substrate support device 20; and a mirror 41, by which the infrared light emitted from the sensor head 40a of the mapping sensor 40 is reflected to fall on the sensor head 40a of the mapping sensor 40, is disposed on the other distal end of the substrate support device 20. In the illustrated embodiment, the mapping sensor 40 is provided with a detecting mechanism (not shown). A light-emitting element and a light-receiving element disposed in the detecting mechanism are connected to the sensor head 40a through optic fibers 42. As shown in FIG. 5, the transfer mechanism 21 moves the mapping sensor 40 so that it scans the wafers W, held by the holder 9 at multiple levels, along the direction in which the wafers W are arranged (i.e., the direction perpendicular to the paper of FIG. 5), so as to detect the presence or absence of a wafer at each level (i.e., on each ring-shaped support plate 15) in the holder 9; thereby to record (map) the detection result associated with positional data that can be obtained based on values of an encoder assigned to the driving system of the transfer mechanism 21. In addition, before and after the heat treatment of the wafers W, it is possible to detect the state (i.e., whether a wafer W sticks out of the holder 9) of each of the wafers W held in the holder 9. The mapping sensor 40 may be used in an automatic teaching operation of the transfer mechanism 21 for detecting a target member for teaching operation located at a target transfer position. In the automatic teaching operation, when the transfer mechanism 21 is moved to a position where an infrared light is interrupted by the target member, the position of the target member can be determined based on an encoder value thereat of the driving system of the transfer mechanism 21.

Figure 11:
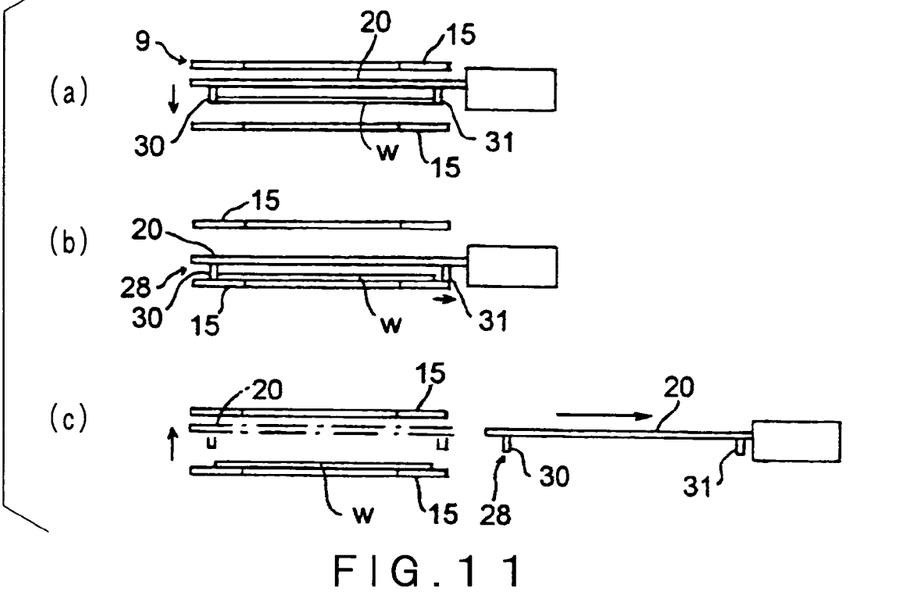
FIG. 11 shows schematic side views illustrating operations of the transfer mechanism.

Referring to FIG. 1, the operation of the transfer mechanism 21 for transferring a wafer W will be schematically described below. At first, the substrate support device 20 is inserted into the container such that the substrate support device 20 is positioned above a wafer W to be transferred. Then, the movable engagement member 31 of the gripping mechanism 28 disposed below the substrate support device 20 is moved toward the fixed engagement members 30 (i.e., closing the gripping mechanism 28) to grip the wafer W. With the wafer W being gripped, the substrate support device 20 is withdrawn from the container to remove the wafer W therefrom. Subsequently, the substrate support device 20 is then positioned above the ring-shaped support plate 15 in the holder 9 (FIG. 11 (a)). Next, the movable engagement member 31 of the gripping mechanism 28 is moved away from the fixed engagement members 30 (i.e., opening the gripping mechanism 28) to release the wafer W from the gripping mechanism 28, so that the wafer W is placed on the ring-shaped support plate 15 (FIG. 11(b)). Thereafter, the substrate support device 20 is elevated and is withdrawn from the holder 9 (FIG. 11(c)). In FIG. 11, only one of the plural substrate support devices 20 is shown for simplicity of the drawings. However, it goes without saying that plural wafers W can be transferred at one time if the plural substrate support devices 20 simultaneously perform the above steps.

The foregoing embodiment can provide the following advantageous effects. Since the transfer mechanism 21 is provided with plural (e.g., five) substrate support devices 20 (20a to 20e) each having a gripping mechanism 28 for gripping a wafer W on a lower side of thereof, plural (e.g., five) wafers W can be transferred at one time to the holder 9 having the ring-shaped support plates 15. Thus, the time required for transferring the wafers W can be significantly reduced. In particular, the gripping mechanism 28 includes: the fixed engagement members 30 fixedly attached to the distal ends of the substrate support device 20 to be engaged with the front edge of the wafer W; and the movable engagement member 31 movably attached to the proximal end of the substrate support device 20 to be disengageably engaged with the rear edge of the wafer W. In other words, the engagement members on the distal ends of the substrate support device 20 are non-movable. Thus, the whole structure of the substrate support device 20 can be simplified and the thickness of the substrate support device 20 can be reduced, as compared with the conventional transfer mechanism B (see, Background Art) in which both the engagement members on the distal and proximal ends of the fork (i.e., substrate support device) are movable. Since the substrate support device 20 of a reduced thickness can be inserted into a narrower space, the arrangement pitch of the ring-shaped support plates 15 of the holder 9 can be reduced from about 16 mm (in the prior art) to about 11 mm. As a result, a larger number of wafers W can be held in the holder 9 of the same size. Thus, the number of wafers to be simultaneously heat-treated can be increased from about 50 to about 75 (1.5 times), resulting in improvement of throughput.

In addition, a wafer W can be easily gripped by the gripping mechanism 28 on the lower side of the substrate support device 20. Moreover, the substrate support device 20 has the seats 34 and 35 that receive the front and rear peripheral portions of the wafer W such that a gap is formed between the lower surface of the substrate support device 20 and the upper surface of the wafer W. Therefore, when the wafer W is gripped by the gripping member 28, the upper surface of the wafer W can be prevented from being rubbed and damaged by the lower surface of the substrate support device 20. Further, since the cutouts 36 and 37 formed in the ring-shaped support plate 15 prevents the ring-shaped support plate 15 from colliding with by the fixed engagement members 30 and the movable engagement member 31, the wafer W can be securely gripped by the gripping mechanism 28 without colliding with the ring-shaped support plate 15.

The mapping sensor 40 is disposed on at least one (substrate support device 20a) of the substrate support devices 20, and the mapping sensor 40 is configured to detect the position of a process object (wafer) W, by moving the substrate support device 20a such that a light beam traveling between the two distal ends of the substrate support device 20a is interrupted by the process object W. Thus, the existence of a process object W on each of the ring-shaped support plate 15 can be detected by scanning plural process objects W placed on the respective ring-shaped support plates 15 in the holder 9 along the direction in which the process objects W are arranged (in the vertical direction). The detection results can be recorded (mapped) in relation to positional data. Further, since it is possible to detect whether a process object W sticks out of the holder 9 before and after the heat treatment of the process object W, troubles such as damage of the process object W can be avoided. The substrate support device 20 has at its distal ends the fixed engagement members 30 which are not of a movable structure. Thus, the mapping sensor 40 can be readily disposed on the distal end of the substrate support device 20, without taking into consideration the collision between the mapping sensor 40 and the fixed engagement members 30, and the whole thickness of the substrate support device 20 can be reduced.

Although the present invention has been described in detail based on the preferred embodiment and example thereof with reference to the drawings, the present invention is not limited thereto, and various changes in design can be made without departing from the scope and sprit of the present invention.

The invention claimed is:

1. A vertical heat treatment system comprising:
a heat treatment furnace having a furnace throat in a lower part thereof;
a lid that hermetically closes the furnace throat;
a holder, disposed on the lid, that holds a plurality of process objects at vertical intervals via ring-shaped support plates;
an elevating mechanism that moves the lid vertically to load and unload the holder into and from the heat treatment furnace; and
a transfer mechanism that transfers process objects between the holder and a container holding therein a plurality of process objects at intervals, the transfer mechanism including:
a plurality of substrate support devices spaced at intervals, each substrate support device having front and rear seats fixedly provided on a lower surface of the substrate support device for respectively receiving front and rear edge portions of an upper surface of a process object, the front seat having an inclined surface directed obliquely downward and the rear seat having an inclined surface directed obliquely downward; and
gripping mechanisms, each-gripping mechanism being configured to grip a process object on an under side of an associated one of the-substrate support devices, each of the gripping mechanisms having a fixed engagement member fixedly provided on a distal end of its associated substrate support device to engage with a front edge portion of a process object, and a movable engagement member movably attached to a proximal end of its associated substrate support device to be disengageably engaged with a rear edge portion of the process object, the fixed engagement member having an inclined surface directed obliquely upward to support a front edge portion of a lower surface of the process object, and the movable engagement member having an inclined surface directed obliquely upward to support a rear edge portion of the lower surface of the process object, whereby
an angle of inclination of the inclined surface of the front seat with respect to a horizontal plane is smaller than an angle of inclination of the inclined surface of the fixed engagement member with respect to said horizontal plane,
an angle of inclination of the inclined surface of the rear seat with respect to said horizontal plane is smaller than an angle of inclination of the inclined surface of the movable engagement member with respect to said horizontal plane, and when the movable engagement member moves forward relative to its associated substrate support device to approach the fixed engagement member and grip the process object, the front edge portion of the process object is held by the inclined surface of the front seat and the inclined surface of the fixed engagement member, while the rear edge portion of the process object is held by the inclined surface of the rear seat and the inclined surface of the movable engagement member, so that a gap is formed between a lower surface of the associated substrate support device and an upper surface of the process object.

2. The vertical heat treatment system according to claim 1, wherein each of the ring-shaped support plates has cutouts for preventing the ring-shaped support plate from colliding with the fixed engagement member and the movable engagement member.

3. The vertical heat treatment system according to claim 1, wherein at least one of the substrate support devices is provided with a mapping sensor, which is configured to detect a position of a detection object by moving said at least one substrate support device such that a light beam traveling between two distal ends of the said at least one substrate support device is interrupted by the detection object.

4. The vertical heat treatment system according to claim 1, wherein the fixed engagement member and the movable engagement member are formed of a heat-resistant resin.

5. A method of transferring process objects comprising:
providing a vertical heat treatment system including:
a heat treatment furnace having a furnace throat in a lower part thereof;
a lid that hermetically closes the furnace throat;
a holder, provided on the lid, that holds a plurality of process objects at vertical intervals via ring-shaped support plates;
an elevating mechanism that moves the lid vertically to load and unload the holder into and from the heat treatment furnace; and
a transfer mechanism that transfers process objects between the holder and a container holding therein a plurality of process objects at intervals, the transfer mechanism including:
a plurality of substrate support devices spaced at intervals, each substrate support device having front and rear seats fixedly provided on a lower surface of the substrate support device for respectively receiving front and rear edge portions of an upper surface of a process object, the front seat having an inclined surface directed obliquely downward and the rear seat having an inclined surface directed obliquely downward; and
gripping mechanisms configured to grip a process object on an under side of an associated one of the substrate support devices, each of the gripping mechanisms having a fixed engagement member fixedly provided on a distal end of its associated substrate support device to engage with a front edge portion of a process object, and a movable engagement member movably attached to a proximal end of its associated substrate support device to be disengageably engaged with a rear edge portion of the process object, the fixed engagement member having an inclined surface directed obliquely upward to support a front edge portion of a lower surface of the process object, and the movable engagement member having an inclined surface directed obliquely upward to support a rear edge portion of the lower surface of the process object, whereby an angle of inclination of the inclined surface of the front seat with respect to a horizontal plane is smaller than an angle of inclination of the inclined surface of the fixed engagement member with respect to said horizontal plane, an angle of inclination of the inclined surface of the rear seat with respect to said horizontal plane is smaller than an angle of inclination of the inclined surface of the movable engagement member with respect to said horizontal plane, placing each of the substrate support devices above a respective process object that is positioned in a transfer start position;

moving the movable engagement the fixed engagement member to grip the process object, so that the front edge portion of the process object is held by the inclined surface of the front seat and the inclined surface of the fixed engagement member, while the rear edge portion of the process object is held by the inclined surface of the rear seat and the inclined surface of the movable engagement member, so that a gap is formed between a lower surface of the associated substrate support device and an upper surface of the process object;

moving the substrate support device that is gripping the process object to a position above a transfer target position; and moving the movable engagement member away from the fixed engagement member to release the process object whereby the process object is mounted on the transfer target position.

* * * * *